United States Patent
Hofmann et al.

(10) Patent No.: US 6,646,506 B1
(45) Date of Patent: Nov. 11, 2003

(54) METHOD FOR LINEARSING HIGH-FREQUENCY AMPLIFIER

(75) Inventors: Heike Hofmann, Backnang (DE); Franz J Hagmanns, Backnang (DE)

(73) Assignee: Marconi Communications GmbH, Backnang (DE)

( * ) Notice: Subject to any disclaimer, the term of this patent is extended or adjusted under 35 U.S.C. 154(b) by 0 days.

(21) Appl. No.: 10/088,364

(22) PCT Filed: Sep. 14, 2000

(86) PCT No.: PCT/IB00/01387

§ 371 (c)(1),
(2), (4) Date: Jul. 17, 2002

(87) PCT Pub. No.: WO01/20776

PCT Pub. Date: Mar. 22, 2001

(30) Foreign Application Priority Data

Sep. 14, 1999 (DE) .......................................... 199 43 957

(51) Int. Cl.[7] .................................................. H03F 1/26
(52) U.S. Cl. ........................ 330/149; 327/307; 375/297
(58) Field of Search ................. 330/149, 129, 330/136; 375/297; 327/307

(56) References Cited

U.S. PATENT DOCUMENTS

| | | | | |
|---|---|---|---|---|
| 5,049,832 A | * | 9/1991 | Cavers | ....................... 330/149 |
| 5,898,338 A | | 4/1999 | Proctor et al. | |
| 5,903,611 A | | 5/1999 | Schnabl et al. | |
| 6,141,390 A | * | 10/2000 | Cova | ........................ 375/297 |
| 6,194,964 B1 | * | 2/2001 | Jun | ............................ 330/149 |

FOREIGN PATENT DOCUMENTS

| | | |
|---|---|---|
| EP | 0 731 556 A1 | 9/1996 |
| WO | WO 01/20776 A1 | 3/2001 |

* cited by examiner

*Primary Examiner*—Henry Choe
(74) *Attorney, Agent, or Firm*—Kirschstein, et al.

(57) ABSTRACT

A predistorter is connected upstream of a high-frequency amplifier to be linearized. A predistortion factor is adaptively modified in the predistorter in such a way as to compensate non-linearities of the amplifier as well as possible. The quotient of the output signal of the high-frequency amplifier and the input signal of the predistorter is produced first. An average amplification is then determined based on the signal quotient. A correction term is produced for the predistortion factor, this correction term being dependent on the extent of the deviation of the average amplification from a set value. The predistortion factor is adaptively modified in such a way as to minimize the correction term.

6 Claims, 1 Drawing Sheet

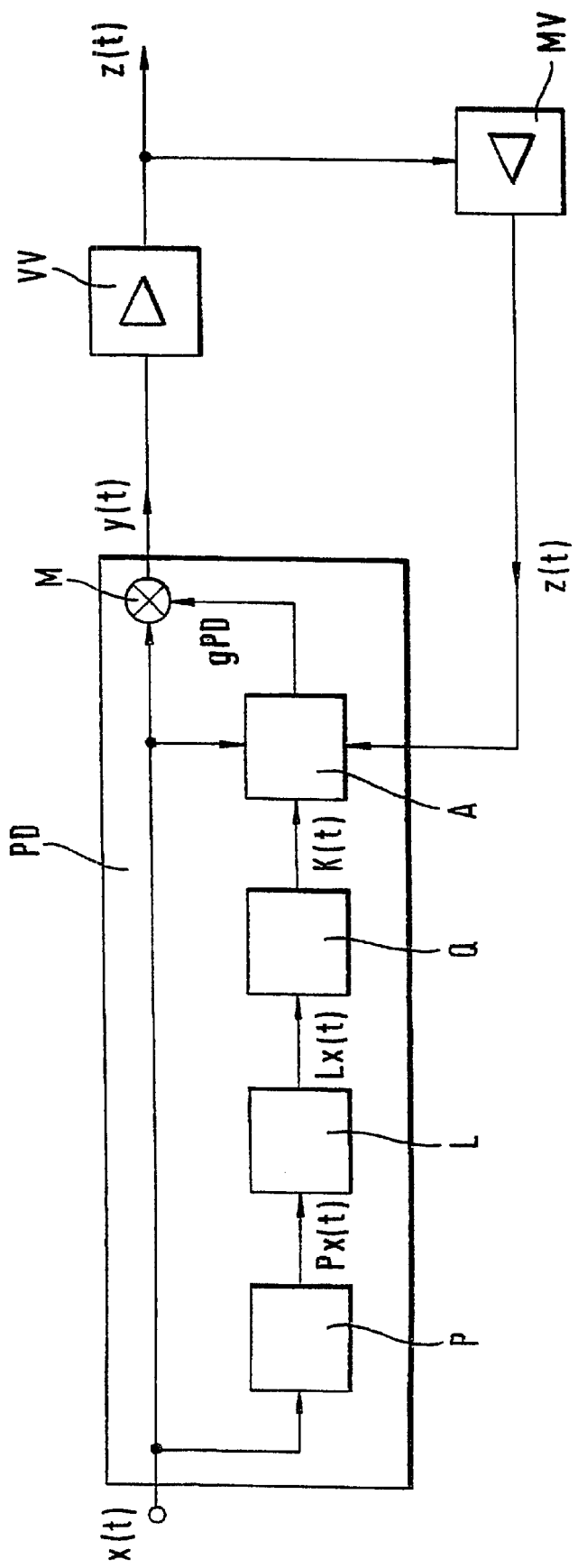

METHOD FOR LINEARSING HIGH-FREQUENCY AMPLIFIER

PRIOR ART

The present invention concerns a method for linearization of a high-frequency amplifier, to which a predistorter is connected upline in which a predistortion factor is altered adaptively so that a linear relation exists between the output signal of the high-frequency amplifier and the input signal of the predistorter.

The transmission behavior of a high-frequency amplifier is highly dependent on its rest current (bias voltage). The higher the bias current, the better the linearity of the amplifier in general. However, the power consumption of the amplifier increases and the efficiency diminishes with the closed-circuit current. This can lead to a significant cost in power supply, cooling, etc., especially in high-frequency power amplifiers. If high linearity of the amplifier is dispensed with, this can be operated with a lower closed-circuit current so that the cost of power supply and cooling of the amplifier is reduced. Operation of the amplifier in its linear control range can be omitted if a predistorter that largely compensates for the distortions of the amplifier is connected upline of the amplifier. Predistorters for high-frequency amplifiers are known from the literature, for example, IEEE Transactions on Communications, Vol. 45, No. 10, October 1997, pp. 1167–1171. The adaptive digital predistorter described in this article operates as follows. The amount of the signal to be predistorted is multiplied by a real value and a real value added to the phase in order to balance the nonlinear effects of the amplifier. The corresponding values for amount and phase are read from a-table whose address is determined from the amplitude of the signal being predistorted. The amount and phase are adapted separately. The correction value to control adjustment of the amount is the difference in amounts of the preamplifier output signal and the signal being predistorted. The correction value for phase adjustment is the difference in phases of the amplifier output signal and the signal being predistorted.

The task underlying the invention is to provide a method of the type just mentioned with which the best possible linearization of a high-frequency amplifier can be achieved.

Advantages of the Invention

The stated task is solved by the features of claim 1, in that the quotient of the output signal of the high-frequency amplifier and the input signal of the predistorter is initially formed and an average amplification then determined from the signal quotient. A correction term is formed for a predistortion factor formed in the predistorter that depends on the deviation of the average amplification relative to a reference value. Finally, the predistortion factor is altered adaptively so that the correction term becomes minimal. According to the invention, the amount and phase of the signal need not be calculated, as in the cited prior art, but instead the quotient of the formed signal, so that the correction term for adjustment can be determined with limited calculation cost.

Since the characteristic of the predistorter is adaptively set with this method, temperature- and aging-dependent amplification changes can also be compensated. An automatic adjustment of the predistorter during operation also makes adjustment of the predistorter during manufacture unnecessary.

Advantageous modifications of the invention are apparent from the subclaims. A particular good convergence during adjustment of the predistorter is obtained by the fact that the correction term for the predistortion factor is formed from the product of an adjustment constant and the difference between the inverse average amplification and 1.

It is expedient that the power or a quantity derived from it be formed from the input signal of the predistorter, that the power or the quantity derived from it then be linearly quantized, that a value of the predistortion factor be assigned to each possible quantization step, that an average amplification be determined for each quantization step, and that for each distortion factor allocated to a quantization step a correction term dependent on the average amplification determined at the corresponding quantization step be formed, which is minimized by adaptive variation of the predistortion factor. The average amplification of each quantization step is advantageously determined by the fact that amplification values are formed over a specified time interval from the time- and value-discrete scanning values of the output signal of the high-frequency amplifier and the input signal of the predistorter, that all amplification values corresponding to a corresponding quantization step are accumulated, and that for each quantization step the amplification value resulting at the end of the time interval from accumulation is divided by the number of accumulation steps.

The adjustment constants preferably have a value dependent on the corresponding quantization step to which the predistortion factor is assigned.

An optimal adjustment rate for the predistortion factor can be achieved by the fact that the smaller of two values is chosen as adjustment constant, in which the one value is 0.5 and the other value depends on the number of accumulations of amplification values in the corresponding quantization step.

BRIEF DESCRIPTION OF THE DRAWINGS

The only FIGURE in the drawing is of a high frequency power amplifier VV—hereafter called amplifier—and a predistorter PD connected upline.

DETAILED DESCRIPTION

The input signal of the predistorter is denoted x(t), the output signal of the predistorter PD is denoted y(t), which is fed to the input of the amplifier VV, and the output signal of the amplifier VV is denoted z(t). The input signal x(t) and therefore also the two other signals y(t) and z(t) are fully analytical, i.e., they have a real and an imaginary part. The input signal x(t) can be a base band signal or a signal in the intermediate or high-frequency range. A quadrature mixer is ordinarily used for transformation of the quadrature component of a base band signal into the intermediate or high-frequency range. If a signal x(t) that also has quadrature components is present in the intermediate frequency range or high frequency range, the depicted arrangement of a predistorter PD and an amplifier VV can also be used in the intermediate and high frequency range. However, if a signal x(t) that has only a real part is present in the intermediate or high-frequency range, the missing imaginary part can also be recovered from the real part of the signal by means of a Hilbert filter that carries out essentially only a 90° phase shift. In the following explanation of the circuit an input signal x(t) in the base band is assumed.

The relation between the input signal y(t) of the amplifier VV and its output signal z(t) can be represented according to equation (1).

$$z(t) = gVV(Ay(t)) \cdot y(t) \quad (1)$$

Here, $Ay(t)=|y(t)|\cdot gVV(Ay(t))$ is a complex amplification factor that depends only on the amplitude $Ay(t)$ of the complex input signal $y(t)$. If the input signal $y(t)$ is broken down into amount and phase, one obtains for the output signal $z(t)$ according to equation (2):

$$z(t)=fAM, VV(Ay(t))\cdot e^{j(fPM,VV(Ay(t))+\Phi y(t))} \qquad (2)$$

The amplitude $Az(t)$ and the phase $\Phi z(t)$ of the complex output signal $z(t)$, according to equations (3) and (4), are then:

$$Az(t)=fAM,VV(Ay(t)) \qquad (3)$$

$$\Phi z(t)=fPM,VV(Ay(t))+\Phi y(t) \qquad (4)$$

In equations (2), (3) and (4), $fAM,VV$ denotes an amplitude-amplitude conversion and $fPM,VV$ denotes an amplitude-phase conversion that are generated in undesired fashion by the amplifier VV. A comparison of equation (1) with equation (2) yields the amplification factor according to equation (5).

$$gVV(Ay(t)) = \frac{fAM, VV(Ay(t))}{Ay(t)} \cdot e^{j fPM,VV(Ay(t))} \qquad (5)$$

The predistorter PD is a nonlinear element, like amplifier VV. A predistortion factor $gPD$ generated by the predistorter is to be set so that it compensates for the nonlinearity of the amplification factor $gVV$ of the following amplifier VV. The relationship between the input signal $x(t)$ and the output signal $y(t)$ of the predistorter PD is represented in equation (6).

$$y(t)=gPD(Ax(t))\cdot x(t) \qquad (6)$$

The predistortion factor $gPD$ is dependent only on the amplitude $Ax(t)$ of the complex input signal $x(t)$. As can be gathered in the circuit shown in the FIGURE, the output signal $y(t)$ of the predistorter PD develops owing to the fact that a multiplier M multiplies the input signal $x(t)$ by the predistortion factor $gPD$. The amplitude $Ay(t)$ and the phase $\Phi y(t)$ of the complex output signal $y(t)$ of the predistorter PD can be described according to equations (7) and (8).

$$Ay(t)=fAM,PD(Ax(t)) \qquad (7)$$

$$\Phi y(t)=fPM,PD(Ax(t))+\Phi x(t) \qquad (8)$$

In equations (7) and (8), $fAM,PD$ denotes the amplitude-amplitude conversion and $fPM,PD$ the amplitude-phase conversion of the predistorter PD. If equations (7) and (8) are introduced into equations (3) and (4), the relations shown in equations (9) and (10) between the amplitude-amplitude and amplitude-phase conversions in the amplifier VV and the predistorter PD are obtained under the secondary condition of perfect linearization, i.e., $Az(t)=Ax(t)$ and $\Phi z(t)=\Phi x(t)$.

$$fAM,PD(Ax(t))=f^{-1}AM,VV(Ax(t)) \qquad (9)$$

$$fPM,PD(Ax(t))=-fPM,VV(f^{-1}AM,VV(Ax(t))) \qquad (10)$$

In equations (9) and (10), which verify how the predistorter PD is to be modeled so that nonlinearity of the amplifier VV is compensated, $f^{-1}$ means the inverse function of $f$. Linearization of the amplifier VV is therefore only possible in the invertibly clear regions of the amplification characteristic. $fAM,PD$ is therefore also invertibly unique.

As shown by the block diagram of the predistorter PD depicted in the FIGURE, the two quadrature components of the input signal $x(t)$ are squared and added in a first functional block P, so that the powers $Px(t)$ of the input signal $x(t)$ lie at the output. $Px(t)=|x(t)|^2$ therefore applies. In the next functional block L, the power $Px(t)$ is clearly imaged in another quantity $Lx(t)$. The other quantity $Lx(t)$ can be $\log Px(t)$, for example. The power $Px(t)$, however, need not be converted into a new quantity $Lx(t)$, but can be fed directly to a next functional block Q. In this functional block Q, the input quantity $Lx(t)$ or directly the power $Px(t)$ is linearly quantized. In the subsequent functional block A, in which adjustment of the predistortion factor $gPD$ occurs, a value of the predistortion factor $gPD$ is placed in the table preferably at each quantization step. The dependence of the predistortion factor on the quantization step is expressed hereafter by $gPD(K(t))$. The quantization steps $K(t)$ then represent the addresses of the table in which the predistortion factors $gPD(K(t))$ are placed.

The functional block A contains the table with the predistortion factor $gPD(K(t))$ and carries out their adjustment. For this purpose, the input signal $x(t)$ of the predistorter PD, on the one hand, and the output signal $z(t)$ of the amplifier VV, on the other, are fed to the functional block A. The output signal $z(t)$ of amplifier VV is picked up by a measurement receiver MV whose task is essentially to transform the output signal $z(t)$ of the amplifier VV back into the frequency position in which the predistorter is implemented. It is assumed here that the measurement receiver MV can be considered ideal. This means that it is supposed to produce much less distortion than the amplifier VV, which is easy to fulfill because of the much smaller signal level of the measurement receiver MV. The functional block A initially forms the quotient from the output signal $z(t)$ of the amplifier VV and the input signal $x(t)$ of the predistorter PD. The two signals $x(t)$ and $z(t)$ are present as time- and value-discrete scanning values, for which reason they are written hereafter as $x(n)$ and $z(n)$. n denotes the consecutive index for the scanning values within a stipulated time. The quotient $z(n)/x(n)$ is then the instantaneous amplification at the scanning time n of the arrangement consisting of the predistorter PD and the amplifier VV.

As shown in equation (11), the amplification values placed in a table addressable by the quantization steps K are determined over the stipulated time interval of the input signal $x(n)$ for each of the quantization steps K, in which the signal quotients $z(n)/x(n)$ pertaining to the same quantization steps are accumulated.

$$V(K) = V(K) + \frac{z(n)}{x(n)} \qquad (11)$$

In equation (12) the number of accumulations for each quantization step K is counted; one can also speak of a hit frequency $T(K)$ for each quantization step K.

$$T(K)=T(K)+1 \qquad (12)$$

If, as shown in equation (13), the amplification value $V(K)$ present at the end of the stipulated time interval is divided by the hit frequency $T(K)$, the average amplification $W(K)$ is obtained at the end of the time interval for the corresponding quantization step K.

$$W(K) = \frac{V(K)}{T(K)} \qquad (13)$$

Let $gPDm(K)$ be the predistortion factor for the $K^{th}$ quantization step in the $m^{th}$ time interval. $Wm(K)$ is the average amplification for the $K^{th}$ quantization step calculated in the $m^{th}$ time interval.

The deviation of the average amplification W(K) from a reference value is used as correction value in order to adapt the predistortion factor gPD(K) until the correction value becomes minimal. If by adjustment of the predistortion factor gPD(K), the correction value ideally becomes 0, the nonlinearity of the amplification factor gVV(K) is fully compensated. Good convergence during adjustment of the predistortion factor gPD(K) to a value that guarantees high linearity of the overall arrangement is achieved with the adjustment equation (14).

$$gPDm+1(K)=gPDm(K)[1+\Delta(K)(W^{-1}m(K)-1)] \quad (14)$$

This adjustment equation (14) states that the predistortion factor gPDm+1 (K) for the current time interval m+1 follows from the predistortion factor gPDm(K) of the preceding time interval m, on which a correction value gPD(K)·$\Delta$(K)(W$^{-1}$m(K)−1) is superimposed. In the correction term, $\Delta$(K) is an adjustment constant dependent on the quantization step K. The correction term is also determined by the deviation of the average amplification from a reference value. In particular, as can be gathered from equation (14), the correction value is dependent on the deviation of the inverse average amplification W$^{-1}$m(K) from 1. It has been found that the predistortion factor gPD(K) exhibits good convergence behavior during the adjustment process because of the correction value so formed. It applies for the adjustment constant $\Delta$(K) that the smaller it is, the more slowly adjustment of the predistortion factor gPD(K) occurs to a value that compensates for the nonlinearity of the amplifier VV. A slower adjustment process means that it converges over several time intervals, which is equivalent to a longer lasting averaging process, so that disturbances, for example, by thermal noise, are better suppressed. Care must be taken for the adjustment process that the predistortion factor does not change too strongly from one time interval to the next. It has therefore proven useful to make the adjustment constant $\Delta$K dependent on the number of hits T(K) as stated in equation (12). As equation (13) makes clear for the average amplification W(K), averaging of the amplification is strongest for those quantization steps K for which the hit rate according to equation (12) is highest. It is useful to let the adjustment constant become greater, the stronger the averaging of amplification W(K) or hit rate T(K) is for the individual quantization steps K. One possible stipulation for adjustment constant is shown in equation (15).

$$\Delta(K)=\min\{0.01T(K);\ 0.5\} \quad (15)$$

This equation (15) states that the adjustment constant $\Delta$(K) is set equal to the smaller of the two values for the corresponding quantization step K, in which the one value is 0.5 and the other value corresponds to one hundredth of the hit rate T(K) of the corresponding quantization step K. It is then assumed that roughly 10,000 scanning values pertain to one time interval for which the average amplification W(K) and the hit rate T(K) are determined.

What is claimed is:

1. A method of linearizing a high-frequency amplifier, comprising the steps of:
    a) connecting a predistorter upline;
    b) adaptively altering a predistortion factor so that a linear relation exists between an output signal of the high-frequency amplifier and an input signal of the predistorter;
    c) forming a quotient from the output signal of the high-frequency amplifier and the input signal of the predistorter;
    d) determining an average amplification from the quotient;
    e) forming for the predistortion factor a correction term which depends on a deviation of the average amplification relative to a reference value; and
    f) continuing to adaptively alter the predistortion factor so that the correction term becomes minimal.

2. The method according to claim 1, wherein the step of forming the correction term is formed from a product of an adjustment constant and a difference between an inverse of the average amplification and the numeral 1.

3. The method according to claim 2, and the steps of forming a power quantity from the input signal of the predistorter, linearly quantizing the power quantity in quantization steps, allocating a value of the predistortion factor to each quantization step, determining an average amplification for each quantization step, and forming, for each predistortion factor allocated to a respective said quantization step, a correction value dependent on the average amplification determined in the corresponding quantization step, the correction value being minimized by adaptive alteration of the predistortion factor.

4. The method according to claim 3, wherein the step of determining the average amplification in each quantization step is performed by forming, over a specific time interval, amplification values from time- and value-discrete scanning values of the output signal of the high-frequency amplifier and the input signal of the predistorter, accumulating all amplification values corresponding to a corresponding quantization step, and dividing, for each quantization step, the amplification value resulting from accumulation at an end of each time interval by a number of accumulation steps.

5. The method according to claim 3, wherein the adjustment constant has a value dependent on the corresponding quantization step to which the predistortion factor is allocated.

6. The method according to claim 5, wherein a smaller of the two values is chosen as the adjustment constant, in which one of the values has a value of 0.5, and in which the other of the values depends on the number of accumulations of the amplification values in the corresponding quantization step.

* * * * *